United States Patent
Huang et al.

(10) Patent No.: US 6,396,338 B1
(45) Date of Patent: May 28, 2002

(54) VARIABLE DELAY LINE DETECTOR

(75) Inventors: Marshall Y. Huang, Rancho Palos Verdes; Mark Kintis, Manhattan Beach; Robert E. Kasody, Hermosa Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/427,453

(22) Filed: Oct. 26, 1999

(51) Int. Cl.$^7$ .............................. H03D 3/00; H04L 27/14
(52) U.S. Cl. ................. 329/336; 329/327; 329/303; 329/341; 375/202; 375/324
(58) Field of Search .................. 329/327, 336, 329/303, 341; 333/138, 156; 375/202, 324

(56) References Cited

U.S. PATENT DOCUMENTS

| | | | |
|---|---|---|---|
| 3,091,743 A | 5/1963 | Wilkinson | 333/127 |
| 3,609,573 A | 9/1971 | Hair | 257/664 |
| 3,988,705 A | 10/1976 | Drapac | 333/109 |
| 4,375,054 A | 2/1983 | Pavio | 333/116 |
| 4,825,177 A | 4/1989 | Teague et al. | 330/295 |
| 5,053,717 A | * 10/1991 | Schulz et al. | 329/300 |
| 5,077,538 A | * 12/1991 | Gehrt et al. | 329/319 |
| 5,563,558 A | 10/1996 | Mohwinkel et al. | 333/127 |

OTHER PUBLICATIONS

"GaAs Nonlinear Transmission Lines for Picosecond Pulse Generation and Millimeter–Wave Sampling" by Rodwell, et al. *IEEE Transactions on Microwave Theory and Techniques*, vol. 30, No. 7, Jul. 1991, pp. 1192–1204.

"Novel Low–Loss Delay Line for Broadband Phased Antenna Array Applications" by Zhang, et al. *IEEE Microwave and Guided Wave Letters*, vol. 6, No. 11, Nov. 1996, pp. 395–397.

"Electronic Communication Techniques" by Paul H. Young, Charles E. Marrow Publishing Company, copyright 1985, pp. 477–479.

"Communication Technology Handbook" by Geoff Lewis, Butterworth–Heinemann Publishing Company, copyright 1994, pp. 197 and 198.

"Communication and Radar Systems" by Nicolaos S. Tzannes, Pentice–Hall Inc., pp. 135–137.

* cited by examiner

Primary Examiner—Arnold Kinkead
(74) Attorney, Agent, or Firm—Katten Muchin Zavis

(57) ABSTRACT

A variable delay line detector (34, 48, 66) includes a power splitter (36, 50, 68), a mixer (44, 62, 72) and a variable delay line (42, 52, 70). Various devices are suitable for the variable delay line (42, 52, 70), such as a non-linear transmission line (NLTL). By providing a variable delay line, the variable delay line detector (34, 48, 66) is adapted to be programmed in real time thus making it suitable in applications where the phase and or frequency of the input signal varies. As such, the variable delay line detector (34, 48, 66) may be used in applications heretofore unknown, such &a an inexpensive demodulator in a frequency hopped spread spectrum system.

17 Claims, 3 Drawing Sheets

VARIABLE DELAY LINE DETECTOR

CROSS REFERENCE TO RELATED APPLICATION

This application is related to a commonly owned Application, filed on even date, for a Wideband Low-Loss Variable Delay Line and Phase Shifter by Mark Kintis, et al., Ser. No. 426,619, now U.S. Pat. No. 6,320,480.

FIELD OF THE INVENTION

The present invention relates to a delay line detector and more particularly to a variable delay line detector which includes a variable delay line which can be programmed to match the characteristics of an incoming signal to enable the detector to be used in applications where the frequency of the incoming ;signal varies, such as in frequency hopped spread spectrum applications.

DESCRIPTION OF THE PRIOR ART

Delay line detectors are generally known in the art. A conventional delay line detector, generally identify with the reference numeral 20, is illustrated in FIG. 1. The delay line detector 20 includes a power splitter 22, which divides the input signal $x(t)=A(t)\sin(\omega_c t)$ into two paths 24 and 26. The path 24 includes a delay line 28 for delaying the signal in path 24 by d, such that the output signal of the delay line 28 is $x(t)=A(t)\sin(\omega_c t+d)$. The signal in path 26, $x'(t)=\sin(\omega_c t)$, is mixed with the signal $x(t)$ in the output delay line 24 by way of a mixer 30. The output of the mixer 30 is low pass filtered by way of a low pass filter 32 which filters out the $\omega_c$ terms from the output, resulting in an output signal $y(t)=(A(t)/2)*\cos(d)$. The output signal $y(t)=(A(t)/2)*\cos(d)$, is a DC signal that represents the phase difference between the signals along paths 24 and 26. As such, the delay line detector functions as a phase detector.

Such delay line detectors are known to be used in various communications and radar applications. For example, such delay line detectors are known to be used as moving target indicators (MTI) as discussed in *Communication and Radar Systems*, by Nicolaos S. Tzannes, Pentice-Hall Inc., pages 135–137. Such delay line detectors are also known to be used as demodulators for demodulating frequency and phase shift modulated signals in communications systems. In some applications, the delay is configured to be one bit long, causing the delay line detector to function as a data detector or demodulator as generally discussed in *Communication Technology Handbook*, by Geoff Lewis, Butterworth-Heinemann Publishing Company, copyright 1994, pages 197 and 198 and *Electronic Communication Techniques*, by Paul H. Young, Charles E. Marrow Publishing company, copyright 1985, pages 477–479, hereby incorporated by reference. In such applications, the delay line is fixed for a specific center frequency, data rate or pulse rate, suitable for the particular application in which the delay line detector is being utilized. As such, the delay line detector cannot be used in applications where the frequency or phase of the input signal varies, such as variable MTI radar applications or as a demodulator for frequency hopped spread spectrum signals. Accordingly, a more complicated and expensive system are known to be used in such applications. Thus, there is a need to provide a relatively less complicated and less expensive method for detecting signals in applications in which the frequency or phase varies.

SUMMARY OF THE INVENTION

Briefly, the present invention relates to a variable delay line detector which includes a power splitter, a mixer, and a variable delay line. Various devices are suitable for the variable delay line, such as a non-linear transmission line (NLTL). By providing a variable delay line, the variable delay line detector is adapted to be programmed in real time thus making it suitable in applications where the phase or frequency of the signal varies. As such, the variable delay line detector may be used as a relative inexpensive demodulator in a frequency hopped spread spectrum system.

These and other advantages of the present invention will be readily understood with reference to the following specification and the attached drawing wherein.

DETAILED DESCRIPTION

The variable delay line detector in accordance with the present invention provides a relatively simple and inexpensive method for detecting and demodulating input signals in which the frequency or phase varies. As will be discussed in more detail below, the variable delay line detector in accordance with the present invention includes a variable delay line, that is programmable in real time making the variable delay line detector in accordance with the present invention suitable for applications heretofore unknown, i.e demodulating frequency hopped spread spectrum signals.

Figure 4:
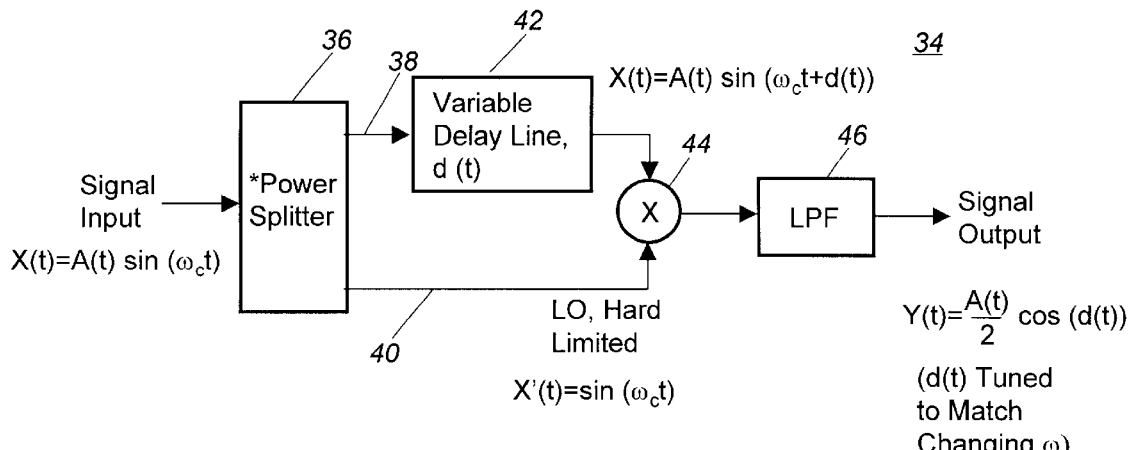
FIG. 4 is a block diagram of a variable delay line detector in accordance with the present invention.

Turning to FIG. 4, the variable delay line detector in accordance with the present invention is illustrated and generally identified with the reference numeral 34. In particular, the variable delay line detector 34 is adapted to demodulate a signal in which the center frequency $\omega_c$ varies and thus can be tuned in real time to match the changing center frequency $\omega_c$. Referring to FIG. 4, the variable delay line detector 34 includes a conventional power splitter 36 for splitting an input signal $x(t)=A(t)\sin(\omega_c t)$ into a first path 38 and a second path 40.

As used herein, the power splitter 36 may be a conventional power splitter in which the signals along the paths 38 and 40 may have equal power and the same phase, such as a so called Wilkinson power divider, for example, as generally disclosed in U.S. Pat. No. 3,091,743. Alternatively, depending on the application, the power splitter 36 may provide signals with different power along the paths 38 and 40, for example, as disclosed in U.S. Pat. No. 5,563,558; or signals having different phases along the paths 38 and 40, for example, a conventional hybrid coupler, or combinations of splitters to provide signals along the paths 38 and 40 having various power and phase combinations.

The signal in the path 40 forms a local oscillator signal LO in the form of $x'(t)=\sin(\omega_c t)$. The signal along path 38 is applied to a variable delay line with a delay characteristic d(t). The output signal from the variable delay line 42 has the form x(t)=A(t)sin($\omega_c$t+d(t)). The output signal x(t) from the variable delay line 42 is mixed with the signal x'(t) from the path 40 by way of a mixer 44. The output of the mixer 44 is low pass filtered by way of a low pass filter 46 to filter out the $\omega_c$ terms. The output signal from the low pass filter 46 is the form y(t)=(A(t)/2)*cos(d(t)), where d(t) is tuned to match the changing center frequency $\omega_c$ of the input signal.

By tuning the variable delay line (and thus d(t)) to match the changing center frequency $\omega_c$ of the input signal, the variable delay line detector 34 provides a relatively simple and inexpensive method for detecting signals with changing frequencies, such as frequency hopped spread spectrum signals. The delay line detector 34 is thus suitable for various applications, heretofore unknown, such as use to demodulate variable data rate communication signals as well in applications, such as a variable moving target indicator (MTI) radar detector.

Various devices are :suitable to being utilized as a variable delay line elements 42. Both discrete and continuously delay line elements 42 are contemplated. For example, a ferroelectric delay line such as a KTN filter, U.S. Pat. No. 5,679,624, or a switch bank of different delay lines may used to provide different discrete delays. In order to provide a continuously variable delay line, a non-linear transmission line (NLTL) may be utilized, as will be described in detail below.

Figure 1:
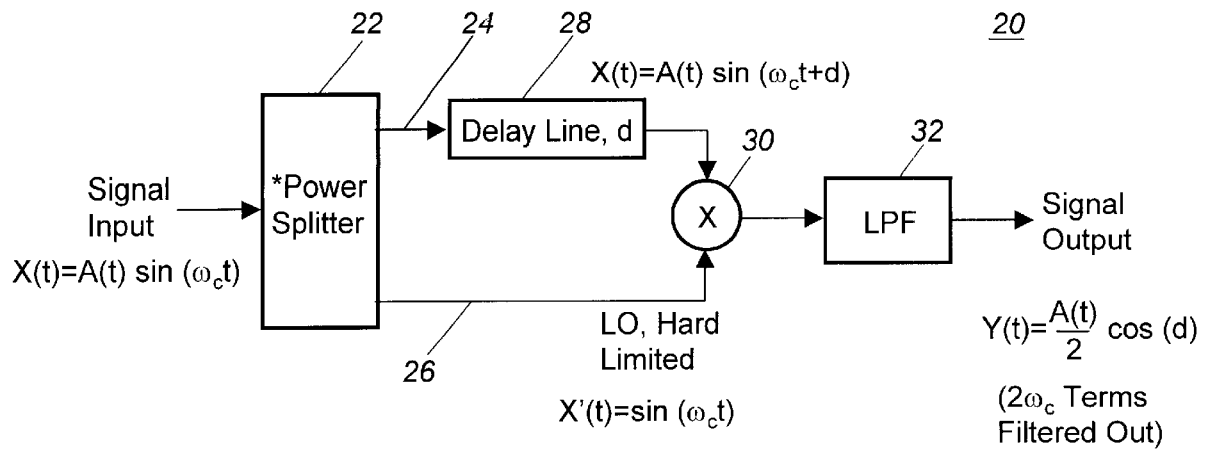
FIG. 1 is a block diagram of a conventional delay line detector.
Figure 2:
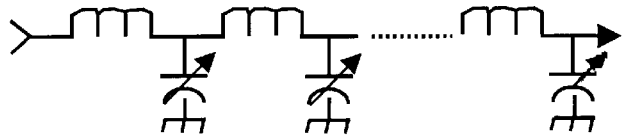
FIG. 2 is a schematic diagram of a non-linear transmission line model.

FIG. 2 illustrates an TLTL. Such NLTLs are relatively well known in the art. Examples of NLTLs are described detail in: "GaAs Non-linear Transmission Lines for Picosecond. Pulse Generation and Millimeter Wave Sampling", by Rodwell et al. "*IEEE Transactions on Microwave Theory and Techniques*, vol. 39, No. 7, July 1991, pages 1194–1204; and "Novel Low-Loss Delay Line For Broadband Phased Antenna Applications" by Zhang et al, *IEEE Microwave Guided Wave Letters*, Vol. 6, No. 11, November 1996, pages 395–397, all hereby as incorporated by reference. Such NLTLs, which may be either microstrip or coplanar waveguide, as illustrated in FIG. 2, generally consist of a transmission line with reverse biased Schottky diodes at different spacings (d) along the transmission line. The reversed biased Schottky diodes serve as voltage variable capacitors.

The delay $\tau$, provided by the NLTL, is directly proportional to the distance (d) between the Schottky barrier diodes and the DC bias voltage applied to the transmission line. Thus, by varying the DC bias voltage applied to the transmission line, the characteristic impedance of the transmission line varies, thus varying the phase velocity and signal delay through the NLTL providing a variable true time delay through the NLTL.

Figure 3A:
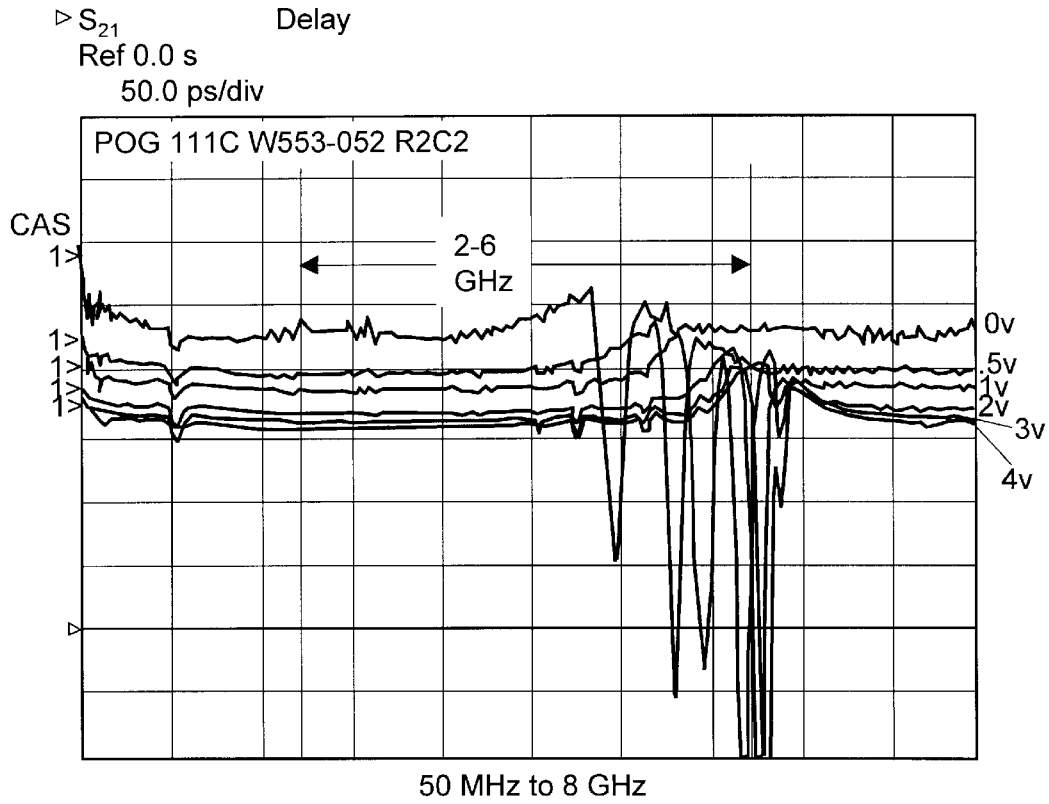
FIGS. 3a and 3b are graphical representations of the delay of a non-linear transmission line for different DC bias voltages as a function of frequency illustrating the bandwidth over which the delay is fairly constant.
Figure 3B:
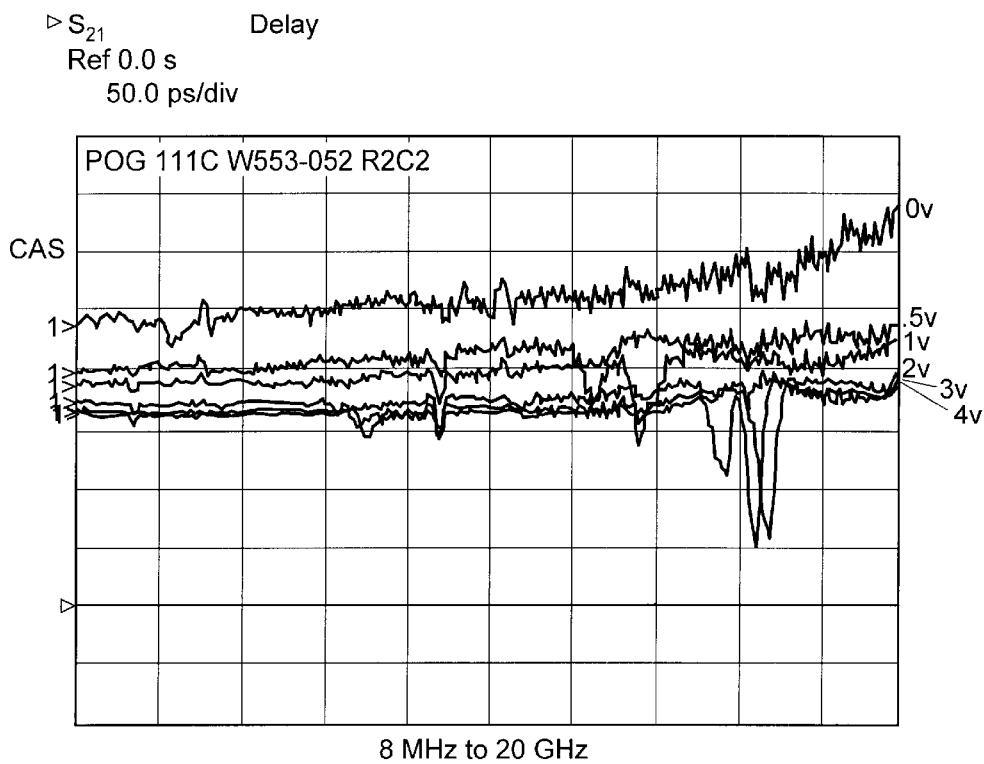

As shown, in FIGS. 3a and 3b, the time delay $\tau$ is plotted along the vertical axes as a function of frequency along the horizontal axes for different time delays $\tau_N$. As shown, the time delay $\tau$ is fairly constant over a significant bandwidth of the NLTL. In particular, FIG. 3a illustrates the time delay $\tau_N$ for various DC bias voltages; 0, 0.5 volts, 1.0 volt, 2.0 volts, 3.0 volts and 4.0 volts from 50 MHz to 8 GHz. FIG. 3b is a similar but over a frequency range between 8 GHz and 20 GHz.

Referring to FIG. 4, when the delay of the variable delay line 42 is small, relative to a reference signal, the device functions as a phase detector, which can be tuned in real time to match the center frequency of the incoming signal to maximize the signal detection. If the delay is approximately one bit interval long and the relatively phase delay is integral multiples of the RF signal, the phase detector will operate as a data detector for differentially coded binary phase shift keying (BPSK)signals. With the variable delay line 42, the detector 34 can track signals x(t) changing frequencies, for example, Doppler and deliberately hopped signals.

Figure 5:
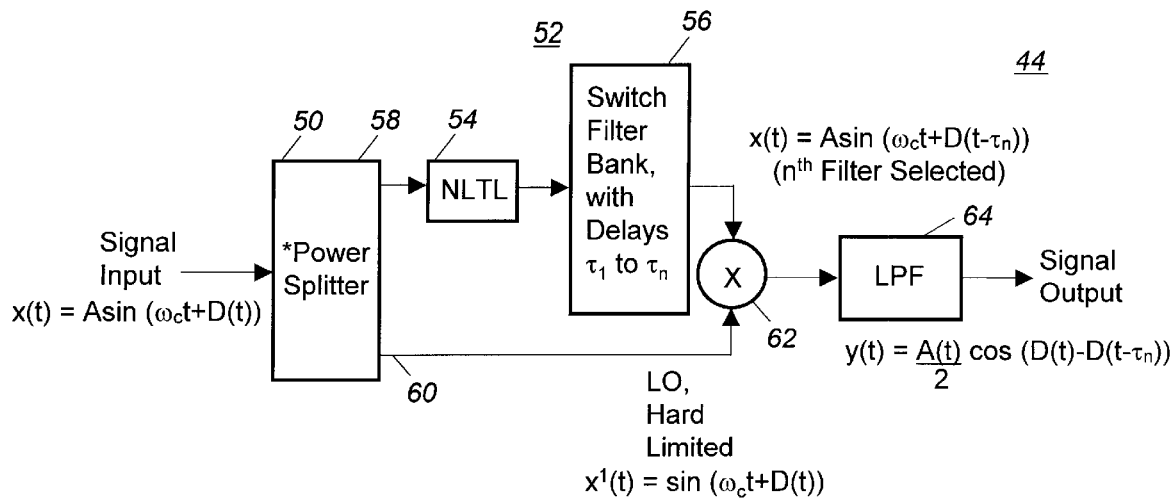
FIG. 5 is a block diagram of a differential data detector and variable moving target indicator (MTI) detector in accordance with another embodiment of the present invention.

With large enough delays, the principles of the present invention can also be used to match the data rate of an incoming signal for efficient spectrum utilization in a bandwidth on demand system, for example, as shown in FIG. 5 to form a differential data detector and variable moving target indicator (MTI) detector 48. The detector 48 can also be used to demodulate BFSK and MSK signals.

Referring to FIG. 5, the differential data and variable MTI detector 48 includes a power splitter 50 and a composite variable delay line 52, formed from a NLTL 54 and a discretely variable delay, for example, a switched filter bank 56. The switched filter bank 56 is adapted to switch in delays $\tau_1$ to $\tau_N$. As discussed above, the power splitter 50 may be a conventional power splitter that essentially splits the incoming input signal x(t)=A sin($\omega_c$t+D(t)) into equal power signals having the same phase along a first path 58 and a local oscillator signal x'(t)=sin ($\omega_c$t+d(t)) along a second path 60. The composite variable delay line 52, formed from a NLTL 54 and the switched filter bank 56 provides an output signal in the form x(t)=A sin($\omega_c$t+D(t−$\tau_N$)) to a mixer 62 and mixes it with the local oscillator signal x'(t). The output of mixer 62 is applied to a low pass filter 64, which filters out the $\omega_c$ terms. The output of the low pass filter 64 is an output signal in the form y(t)=(A(t)/2)* cos(D(t)−D(t−$\tau_n$)).

In the detector illustrated in FIG. 5, the delay provided by the non-linear transmission line 54 is used to match the RF phase of the input signal, while the delay provided by switched filter bank of fixed delay lines $\tau_1$ to $\tau_N$ 56 is used to match the data rate. The device that detector 48 can also be used to modulate BFSK and MSK signals.

The embodiment illustrated in FIG. 5 can also be used as a moving target indicator (MTI). In an MTI radar system, narrow pulses are transmitted and the received signals are coherently detected to measure the Doppler frequency of the return signals and compare it with the rate of the return pulses. A moving target is distinguished by a change in frequency and the period between pulses. Because on ambiguity can exist in the return pulses if the target moves so that it travels at exactly an integer multiple of the pulse rate in which case the pulse rate, does not change, known MTI radar systems are known to have two or more repetition rates to resolve these ambiguities. The demodulators of such radars are known to be relatively complicated and inexpensive. The detector 48 in accordance with the present invention can be used to detect such radar signals and resolve the ambiguities in a relatively simple and inexpensive manner.

Figure 6:
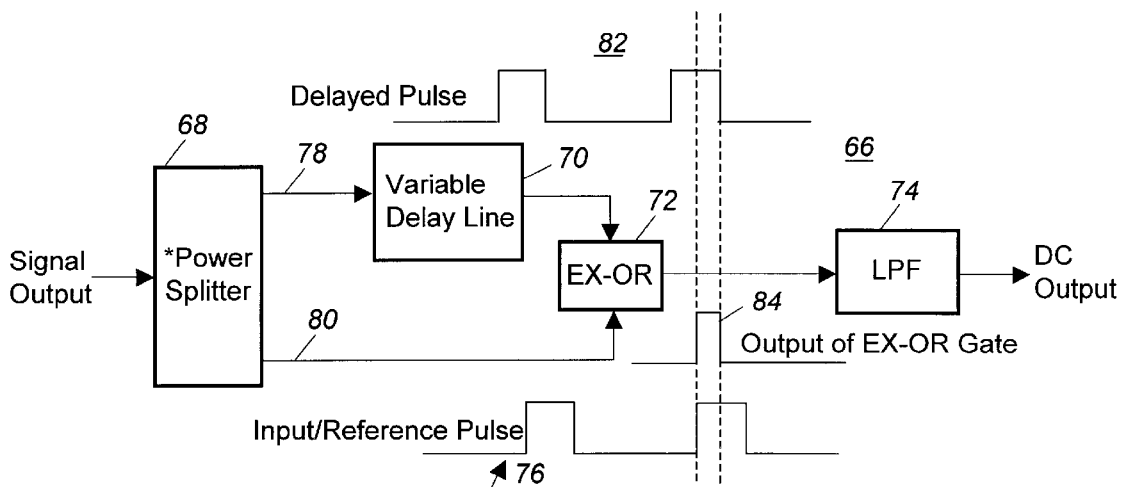
FIG. 6 is a block diagram of a variable delay line pulse counting discriminator in accordance with another alternative embodiment of the present invention.

The principles of the present invention can also be used to form a variable delay line pulse counting discriminator 66, as illustrated in FIG. 6. The discriminator 66 includes a conventional power splitter 68 as discussed above, a variable delay line 70, an exclusive OR gate 72 and a low pass filter 74. The power splitter 68 divides the input signal, in this case a series of pulses, as indicated by the wave form 76, along a paths 78 and 80. The variable delay line 70 delays the input pulse train by a programmable amount and outputs delayed pulses, as illustrated by the waveform 82. The delayed pulses 82 and the input/reference pulses 76 are applied to the exclusive OR gate 72, which outputs a relatively narrow pulse 84 for every input pulse. This pulse 84 may be then averaged by the low pass filter 74 to provide a DC output. When the output of the exclusive OR gate 72 is a logical 0, the output of the low pass filter is also a logical 0. Thus, when a DC voltage as appears at the output of the low pass filter 74, it indicates a single pulse. As such, the detector 66 functions used as a pulse counting discriminator 66.

Obviously, many modifications and variation of the present invention are possible in light of the above teachings. Thus, it is to be understood that, within the scope of the appended claims, the invention may be practiced otherwise than as specifically described above.

What is claimed and desired to be covered by a letters patent is as follows:

1. A detector for detecting the phase of an input signal having a frequency $\omega_c$ relative to a reference signal, the detector comprising:
   a power splitter for splitting the input signal into a first signal along a first path and a second signal along a second path;
   a variable delay line connected to said first path for providing a programmable variable delay to said first signal along said first path by a predetermined delay and providing a delayed signal;
   a mixer for mixing said delayed signal with said second signal and generating an output signal; and
   a filter for filtering said output signal and providing a DC signal representative of the phase difference between said input signal relative to said reference signal, wherein said variable delay line includes a non-linear transmission line (NLTL).

2. The detector as recited in claim 1, further including means for providing a continuously variable DC bias voltage to said NLTL to provide a continuously variable delay.

3. The detector as recited in claim 1, further including means for providing a discretely variable DC bias voltage to said NLTL to provide a discretely variable delay.

4. The detector as recited in claim 3, wherein said discretely variable DC bias voltage is a digital signal having a logical 0 state and a logical 1 state.

5. The detector as recited in claim 1, wherein said variable delay line includes a switched bank of delay lines.

6. The detector as recited in claim 1, wherein said variable delay line includes a ferroelectric delay line.

7. The detector as recited in claim 1, wherein said variable delay line provides a composite delay formed from a discretely variable delay and continuously variable delay.

8. The detector as recited in claim 7, wherein said variable delay line includes a switched filter bank for providing discretely variable delays.

9. The detector as recited in claim 7, herein said variable delay line includes a non-linear transmission line adapted to receive a continuously variable DC bias voltage for providing a continuously variable delay.

10. The detector as recited in claim 1, wherein said power splitter splits said input signals to equal power signals.

11. The detector as recited in claim 1, wherein said power splitter splits said input signal to a first signal and a second signal having the same phase.

12. A detector for detecting the phase of an input signal having a frequency $\omega_c$ relative to a reference signal the detector comprising:
    a power splitter for splitting the input signal into a first signal along a first path and a second signal along a second path;
    a composite variable time delay connected to said first path for providing a composite delay to said first signal, said composite variable time delay including a continuously variable delay line serially coupled to a discretely variable delay line for providing a delay signal;
    a mixer for mixing said delayed signal with said second signal and generating an output signal; and
    a filter for filtering said output signal a providing a DC signal, representative of a predetermined characteristic of said input signal.

13. The detector as recited in claim 12, wherein said predetermined characterisic is a logical value of said input signal.

14. The detector as recited in claim 12, wherein said predetermined characteristic is representative of a change in Doppler frequency.

15. The detector as recited in claim 12, wherein said continuously variable delay line includes a non-linear transmission line.

16. The detector as recited in claim 12, wherein said discretely variable delay line includes a bank of switched delays.

17. A pulse counting discriminator for counting input pulses comprising:
    a power splitter for splitting the power of said input pulses into a first pulse along a first path and a reference pulse along a second path;
    a programmable variable delay line coupled to said first path for providing a delayed pulse with a programmable delay;
    an exclusive OR gate, for exclusive OR'ing said delayed pulse and said reference pulse and providing an output pulse indicative that an input pulse was applied to the power splitter, wherein said programmable variable delay line is continuously variable and wherein said programmable variable delay line includes a non-linear transmission line.

* * * * *